(12) United States Patent
Gollomp et al.

(10) Patent No.: US 6,285,191 B1
(45) Date of Patent: Sep. 4, 2001

(54) MEASUREMENT OF CURRENT IN A VEHICLE USING BATTERY CABLE AS A SHUNT

(75) Inventors: Bernard P. Gollomp, Palisades, NY (US); Thirumalai G. Palanisamy, Morris Township, Morris County; John Kacerek, Madison, both of NJ (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/415,310

(22) Filed: Oct. 8, 1999

(51) Int. Cl.$^7$ ................................................. G01N 27/416
(52) U.S. Cl. ............................................. 324/427; 324/428
(58) Field of Search ..................................... 320/161, 162, 320/132, 137; 324/427, 428

(56) References Cited

U.S. PATENT DOCUMENTS

| | | | | |
|---|---|---|---|---|
| 5,381,097 | * | 1/1995 | Hirzel ................................. | 324/512 |
| 5,444,378 | * | 8/1995 | Rogers ............................... | 324/428 |
| 5,589,757 | * | 12/1996 | Klang ................................. | 320/160 |
| 5,691,078 | * | 11/1997 | Kozaki et al. .................... | 324/428 |
| 5,847,566 | * | 12/1998 | Marritt et al. ................... | 324/427 |
| 6,037,749 | * | 3/2000 | Parsonage ........................ | 320/132 |

* cited by examiner

Primary Examiner—Peter S. Wong
Assistant Examiner—Lawrence Luk
(74) Attorney, Agent, or Firm—Loria B. Yeadon (57) ABSTRACT

Current flowing into and out of a battery installed in a vehicle (V) with the required cable between one of the battery terminals and a reference point on the vehicle is determined by measuring the voltage across the cable and computing the current from the digital value of the measured current. The resistance value of the cable can be known in which case the current is computed using Ohms law and a differential current sensor can be used to respond to the voltage measured across the cable to accommodate for different ranges of current. In an embodiment where the cable resistance is unknown, a reference current source produces a known voltage that is used to set the input value to an amplifier of fixed gain for the voltage measured across the cable by controlling the output of a potentiometer so that the amplifier output voltage can be set to match the reference current generator output voltage, thereby establishing the voltage output of the amplifier as a measurement of the current flow in the cable.

14 Claims, 3 Drawing Sheets

MEASUREMENT OF CURRENT IN A VEHICLE USING BATTERY CABLE AS A SHUNT

FIELD OF THE INVENTION

The present invention relates to the measurement of electrical current and particularly to measuring current in a vehicle using one or both of the cables of a vehicle connected to its battery.

BACKGROUND OF THE INVENTION

In many applications an electrical current has to be measured and monitored. For example, in vehicles having a battery used for various purposes, such as starting an engine or powering electrical systems such as lights and instruments, current is measured and monitored for instrumentation control purposes. For example, U.S. Pat. No. 4,937,523 entitled "Method for Monitoring Automotive Battery Status", which is assigned to the assignee of the subject application, describes an analysis system in which current is measured and monitored during operation of an automobile to determine capacity, state of charge and certain fault conditions of the vehicle's battery. Such a system can also be used for other types of vehicles, such as aircraft, buses, etc.

One technique for electrical current measurement and/or monitoring the current flow in the electrical systems of automotive, aircraft and other vehicles requires a sensor that effectively measures the magnetic field caused by a current flowing through a conductor. Some of the commonly used sensor types are Hall effect and inductive devices. Another technique, used in the aforesaid patent, is that of a precision resistance shunt of a known resistance value which is placed in series with a part of the conductor carrying the current to be measured. By measuring the voltage across the shunt and knowing its resistance, the current can be calculated.

While the use of a shunt is adequate for many purposes, it has disadvantages in that it requires the cost of the shunt itself and additional electrical connections. More importantly, the shunt results in a power loss which is a product of the square of the current value times the resistance value of the shunt. For example, if a one ohm shunt is used to measure current flow in the electrical system of an automobile, the power loss due to the resistance heating of the shunt would be substantial and could cause unnecessary fuel consumption in the vehicle.

Accordingly, it would be desirable to be able to measure current in a vehicle having a battery without the necessity of using an additional element such as a shunt or another type of sensor.

SUMMARY OF THE INVENTION

The battery used in a vehicle typically has two terminals, one of which is connected to a vehicle electrical reference point (ground) such as its metal chassis and the other to provide the operating voltage to a takeoff supply point. In most vehicles, a cable is provided between each of the battery terminals and its connecting point, such as ground or the vehicle system voltage supply takeoff point. In accordance with one embodiment of the invention, one or both of the battery cables is made to have a known resistance value. For example, a typical value would be 1.0 millohm for the cable connected to the positive battery terminal and 0.1 millohm for the cable connected to the battery negative terminal.

In accordance with the invention, the current flow through a cable connected to the battery into the battery, such as during charging by the vehicles alternator, or the flow from the battery, such as during engine starting or operation of any other vehicle electrical system component, is determined by measuring the voltage across the existing and necessary vehicle cable. The current is determined by measuring the voltage drop across the cable of known resistance value and computing, such as by using a computer, the current by the well known Ohm's law formula I=E/R.

In one embodiment of the invention, a differential current sensor is used. The current sensor is an electronic amplifier type device whose characteristics can be modified to accommodate different current ranges. In a preferred embodiment, to accommodate for the possibility of the cable resistance being different from the desired value and other circuit tolerance variations, an auto-calibration circuit is used which permits an accurate measurement of battery current to be made without the need to know the exact resistance of the cable. Also, provision is made to automatically compensate for component tolerances that would cause an offset when the system input current is zero.

It is therefore an object of the present invention to provide for the monitoring and measurement of current in a vehicle having a battery using one of the existing and necessary battery cables as a part of a sensor arrangement.

In accordance with one aspect of the invention a cable of known resistance value is connected to one of the terminals of a vehicle battery through which current flows is used to provide the input to a differential current sensor to measure and monitor battery current flow.

In accordance with another aspect of the invention a current sensor for a vehicle in which one or both of the cables connected to the vehicle's battery terminals is made to be of a known resistance value and is used as shunt for measuring current.

In accordance with a further aspect of the invention the voltage across a cable connected to one of the terminals of a vehicle battery through which current flows is provided to a circuit for measuring and monitoring the battery current having auto-calibration capability which permits an accurate measurement of the current to be made without the need to know the exact resistance of the cable.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
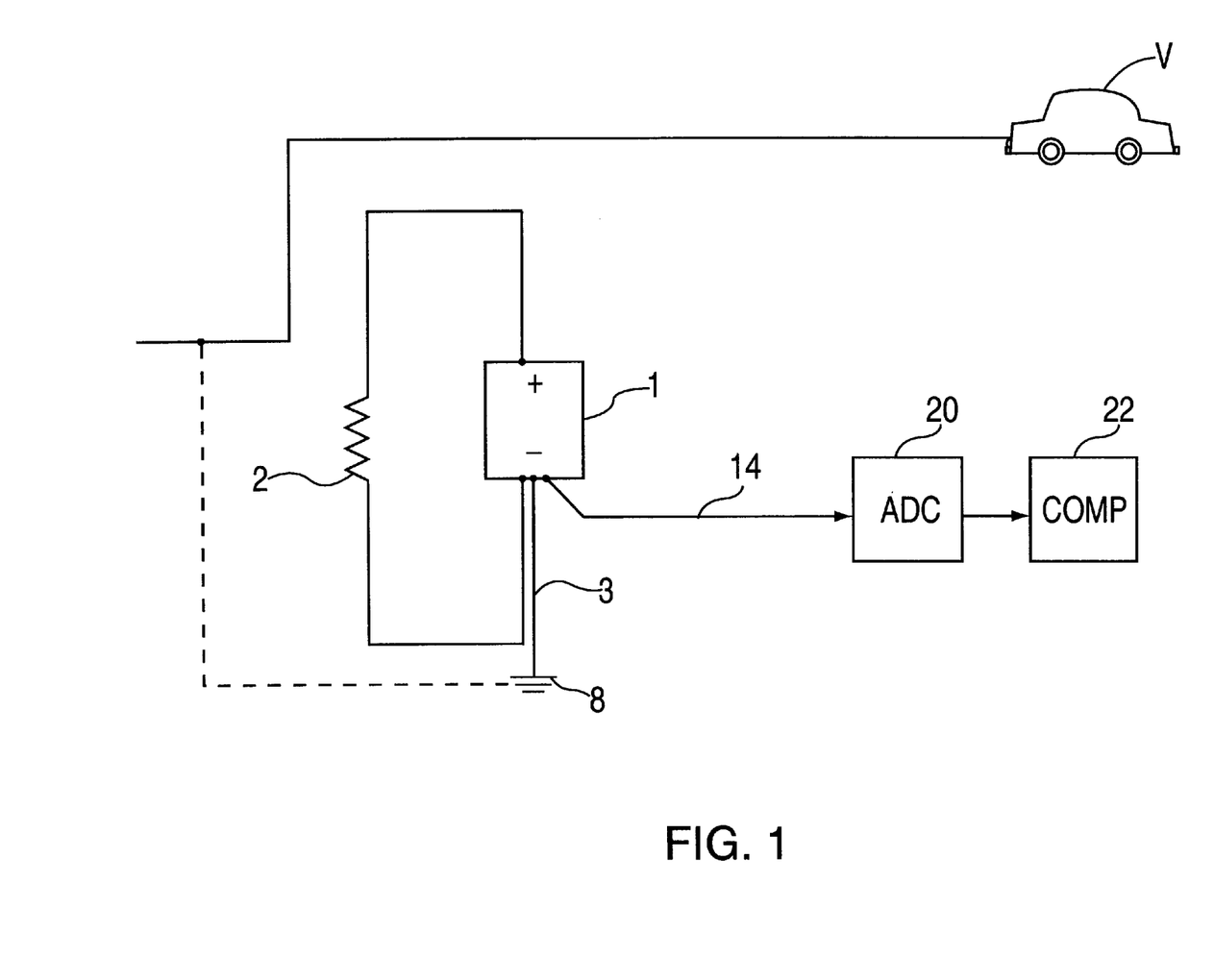
FIG. 1 is a schematic diagram of one illustrative embodiment of the invention comprising a current measurement and monitoring circuit using the existing battery cable in a vehicle.

Referring to FIG. 1, the body of a vehicle, such as an automobile, aircraft, bus, or boat is designated V. The vehicle body is generally of metal and has an electrical ground reference 8 which can be the vehicle frame or chassis. Within the vehicle is a battery 1 of any conventional type, such as lead-acid, used to supply power for normal purposes such as starting, lighting and instrumentation (SLI). Battery 1 has the usual positive and negative terminals. Reference numeral 2 designates the electrical load of the vehicle that is serviced by the battery. The load 2 is shown connected between the battery positive terminal and the electrical reference ground 8 and can be of any suitable type, such as a starter motor, lights, air conditioning system, etc. The battery charging system, which is of any conventional type, is not shown.

An electrical conductor cable 3 is connected between the battery negative terminal and the ground reference 8. This is commonly called the ground return cable. Cable 3 is a necessary component of the electrical system found in virtually all vehicles having a battery. In accordance with one embodiment of the invention, cable 3 is made to have a known resistance value. This can be, for example, 0.1 millohms, although any other suitable value can be used depending upon the overall requirements of the vehicle electrical system. Any current flowing into battery 1, such as during charging, or flowing out of the battery, such as during operation of an electrical system, will flow through the cable 3.

In many cases, such as for operation of instrumentation and control systems, it is desired to measure and monitor the current flow into and out of the battery. To accomplish this in the embodiment of FIG. 1 the voltage drop across cable 3 is used. This voltage will vary depending upon the current flow to and from battery 1. The voltage appearing across cable 3, which is an analog quantity, is applied over lead 14 to the input of an analog-digital converter 20 which converts it to a digital quantity. The digital quantity is supplied to a computer 22 which has programmed therein the resistance value of the cable 3. Thus, the computer is able to compute the current flow to and from the battery 1 by using the usual well-known Ohm's law formula I=E/R, where I=the current
E=the value of the voltage measured across cable 3
R=the resistance value of cable 3.

Accordingly, the arrangement shown in FIG. 1 is capable of monitoring the current without the need for any additional component, such as a shunt used with cable 3, which would consume power, or another type of sensor and any connections that they would require. The computed current value is available for any desired purpose. There can be a continuous monitoring of the current flow so that information can be supplied to a battery monitoring system of the type disclosed in the aforesaid patent. All of this is accomplished simply and efficiently.

Figure 2:
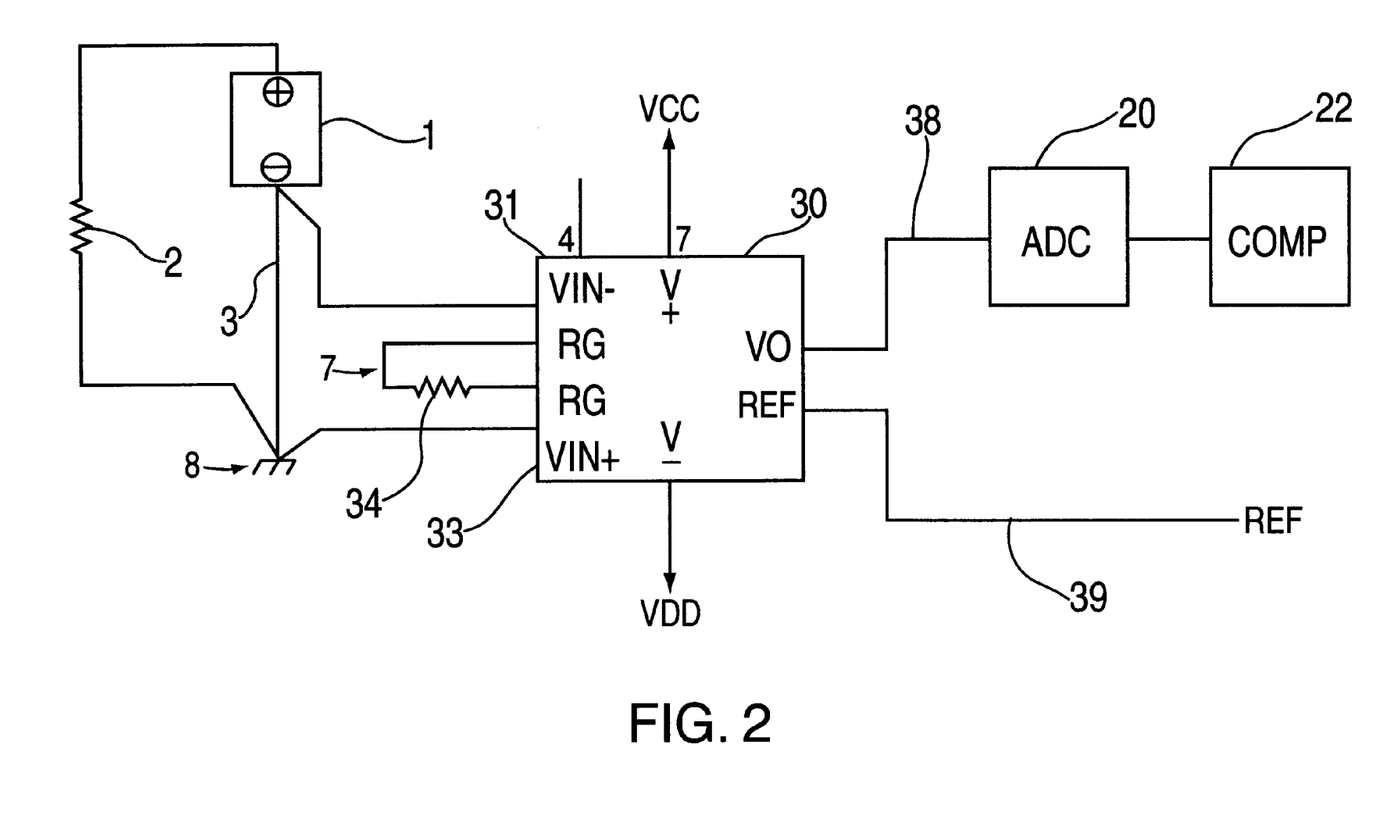
FIG. 2 is a schematic diagram of another specific illustrative embodiment of the invention in wherein a current measuring and monitoring circuit uses an existing vehicle battery cable with a differential amplifier.

FIG. 2 shows another embodiment of the invention that uses a differential current sensor. The same reference numerals are used for the common elements shown in FIG. 1. Element 1 is the vehicle battery, 2 is the vehicle electrical system load supplied by the battery and 3 is the cable of known resistance value between the battery's negative terminal and the vehicle electrical ground reference 8.

An instrumentation amplifier 30 has input terminals 32 and 33 connected respectively to the battery negative terminal and the vehicle electrical ground reference 8. The instrumentation amplifier 30 can be, for example, of type AWA 118 manufactured by Burr-Brown. The input terminals of such a device have a high input impedance. The device 30 also has a resistor 34 connected between appropriate terminals to set its gain. Device 30 is also shown as receiving a positive operating voltage from a source Vcc and a negative voltage from a source Vdd. Device 30 has an output terminal 38 and a reference terminal 32.

The voltage across cable 3, corresponding to the current flowing through it, is sensed at the high impedance input terminal 32 of the device 30. The gain of device 30 is set by resistor 34 to any suitable value, for example in a range of ±5 volts input (the range of the voltage change across cable 3) to correspond to a range of ±1000 Amperes of current flowing through the cable. Thus, as the voltage across cable 3 varies, corresponding to a variation in current flow, the signal at device 30 input terminal 32 changes.

The output on device terminal 38 will be an analog voltage which corresponds to the current flowing through cable 3 into and out of the battery. This is supplied to the A/D converter 20 whose output digital signal is supplied to the computer 22 which is programmed to be able to make the current flow computation.

The reference terminal 39 of device 30 can be adjusted to offset the device 30 output range. If a bipolar A/D converter 20 is used, the reference terminal 39 of device 30 would be set near zero depending on the internal offset of the amplifier device itself. If the converter 20 is unipolar, the reference terminal 39 would be set at the center of the voltage range of the converter.

The output 38 of the amplifier device 30 can be amplified further to obtain smaller current ranges such as, for example, ±100 Amperes and ±10 Amperes. That is, circuit resolution is increased for a higher voltage input to A/D converter 20 since it can be resolved into finer increments. The computer 22 can be programmed with an algorithm to automatically determine which of the ranges to use for the battery current at any given time.

Figure 3:
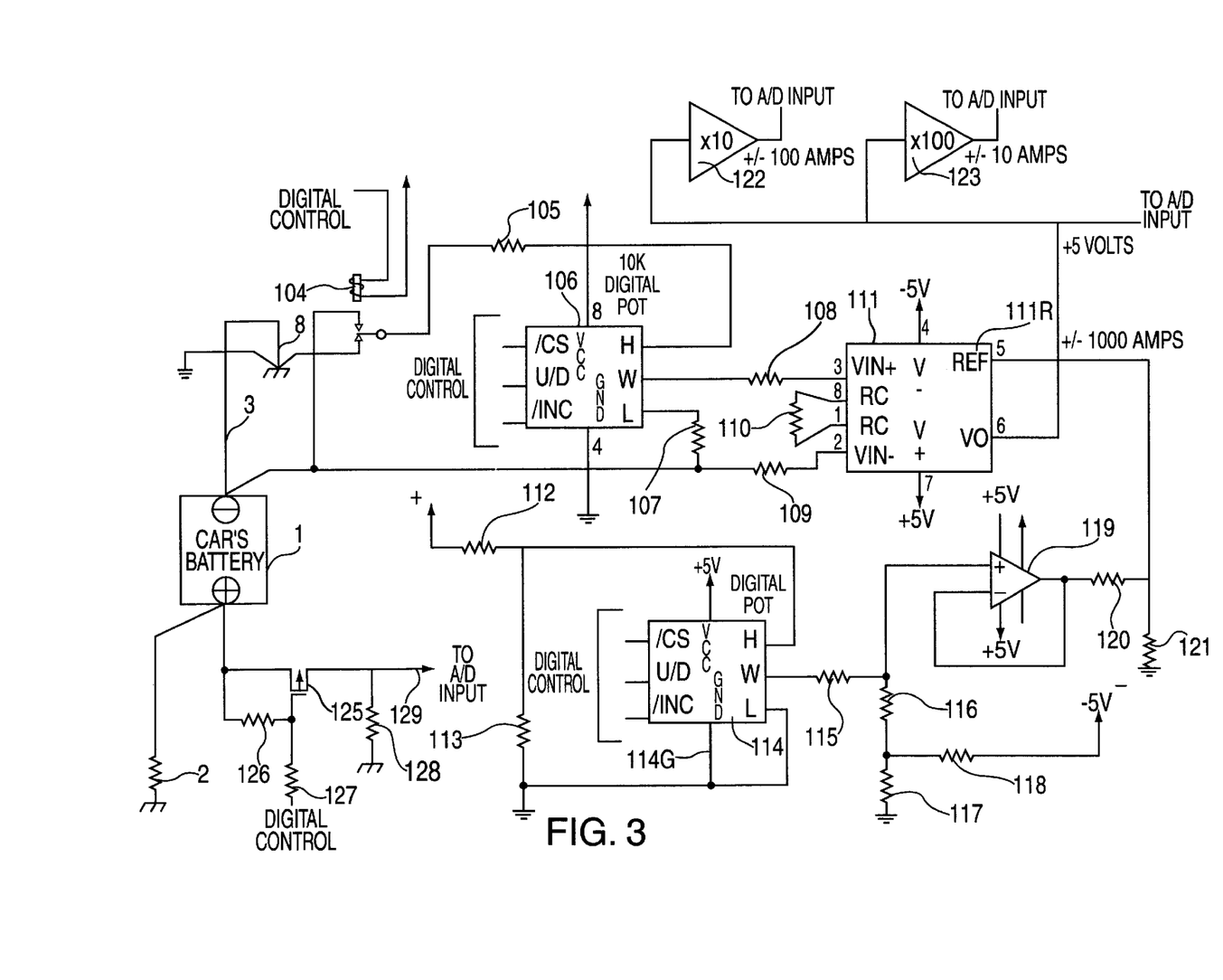
FIG. 3 is a schematic diagram of another illustrative embodiment of the invention wherein the circuit has an auto-calibration capability.

FIG. 3 shows another embodiment of the invention which operates without knowing the exact resistance value of the cable. This is to provide three main functions for monitoring the battery current of a vehicle. The first function is to measure the current going both in and out of the battery. The second is an auto-calibration circuit which calibrates the battery's return cable used as a shunt to allow accurate measurement of the battery's current. The auto-cal circuit eliminates the need for knowing the exact impedance (resistance) of the cable. This can vary with manufacturing tolerances and also varies depending on the model of the car. The third function is to provide for automatic compensation for component tolerances that would cause an offset when the system input current is zero.

In FIG. 3 the following elements are used with the same reference numerals applied as used in FIGS. 1 and 2. As before, 1 indicate the car battery, 2 the vehicle electrical load, 3 the ground return cable and 8 the ground reference connection point of the vehicle frame. There is an auto-zero relay 104 whose operation is controlled by digital signals from computer 22 in accordance with an application program or by a dedicated digital controller having an embedded program. In the following description the term controller is used but it should be understood that the controller can be part of a computer. One contact of relay 104 is connected to the negative terminal of battery 1, to which cable 3 is connected, and the other contact to the ground reference point 8. The relay 104 center arm is connected to a resistor 105 which serves as the input to a variable voltage divider which includes an adjustable digitally controlled potentiometer 106 having a resistor 107 connected between its output terminal and ground 8. The center arm pick off point of potentiometer 106 can be set by applying digital signals from the controller to its input terminals.

A resistor 108 connects the output of the voltage divider 105–107 to the positive input terminal of an instrumentation amplifier 111 which has an input resistor 109 between its negative input terminal and the negative battery terminal to which cable 3 is connected. Amplifier 111 can be of type INA 118 made by Burr-Brown. There is a resistor 110 at the input of amplifier 111 to set its gain.

Resistors 112 and 113 connected between the circuit positive voltage supply point and ground are part of a voltage divider for the auto-zero circuit which includes another adjustable digital potentiometer 114 controlled by the controller. Resistor 115 at the output of potentiometer 114 is connected to the upper end of a voltage divider formed by resistors 116 and 117 whose junction receives voltage from the circuit negative supply. The upper end of this voltage divider is connected to the input of a buffer amplifier 119 whose output is connected to ground by resistors 120 and 121. This provides a negative bias for the auto-zero circuit enabling the voltage at the input of amplifier 119 to swing negative without the need of the output voltage of potentiometer 114 to go negative.

There is a connection from the junction of resistors 120 and 121 to the reference terminal 111R of amplifier 111 to provide a divided down low impedance drive for the amplifier 111 reference voltage.

Each of amplifiers 122 and 123 has its input connected to the output $V_o$ of amplifier 111. Each of the amplifiers 122 and 123 has a selected gain to have an output to correspond to a current range. For example, amplifier 122 has a gain of 100 representing a current range of ±10 Amps and amplifier 123 a gain of 10 to provide an output representing ±100 Amps. The output of each of the amplifiers 122 and 123 is connected to the ADC 20 of FIG. 1 which is a data input to the controller or computer 22.

A transistor 125, such as a PMOS device, along with its bias resistors 126 and 127 is a reference current source. A signal is applied from the controller to the lower end of resistor 127 to turn on the device 125 and produce a voltage across a resistor 128 which is a precision resistor of known value, for example 10 ohms. The output voltage of device 125 across resistor 128 corresponds to a current value that can be computed since the value of resistor 128 is known. This voltage on line 129 is applied to the ADC and is used by the controller for calibrating the system gain.

In the operation of the circuit of FIG. 3, current from the car's battery 1 flows through the car's load 2 and back to the battery via the battery return cable 3. By measuring the voltage across the return cable 3 the current flow in and out of the battery can be calculated. The voltage at the battery negative terminal, which is the voltage across cable 3, is applied from the lower contact of relay 104 across voltage divider 105, 106, 107. A part of this voltage is taken from the center arm terminal of the digital potentiometer 106 and applied to the positive input of amplifier 111. Amplifier 111 has an output swing, for example over a range ±5V, that corresponds to a range of current, for example ±1000 Amps, flowing through cable 3. This is provided to the input of ADC 20. The output of amplifier 111 also is applied to the inputs of amplifiers 122 and 123 of different gain and the outputs of these amplifiers are applied to ADC 20. The outputs of amplifiers 122 and 123, which also can be over a ±5V range, correspond to other ranges of the current flow as indicated above.

To make an accurate measurement requires properly setting the voltage divider 105–107 feeding the fixed gain amplifier 111 to correspond to the resistance of cable 3, whose value is unknown. This is accomplished by the controlled voltage divider 105, 106, 107 in the path leading from cable 3 to the input to amplifier 111. The fixed gain of amplifier 111 is set by resistor 110. The range of the voltage output of divider 105, 106, 107 combined with the gain of amplifier 111 will cover the range of voltage variation applied to the input of amplifier 111 caused by variations in the resistance of cable 3.

Adjustment of the divider 105–107 is accomplished by using the reference current from source 125 that can be switched on and off. As previously described, since the value of precision resistor 128 is known the controller can calculate a current from the measured voltage across resistor 128. The controller periodically switches the current from source 125 on and off, and the difference between the voltage across resistor 128 and that at the output of the ±10 Amp amplifier 122 is measured. Based on this difference the controller adjusts divider 105–107, by moving the arm of the digitally controlled potentiometer 106, so as to obtain an output difference equal to the switched reference current. For example, if the reference current is a 1 amp pulse the voltage pulse at the output of amplifier 122 (±10 amp range) would be 500 mv peak to peak since ±5 volts (the range of the amplifier output) represents ±10 amps.

With the output of amplifier 111 having been set by the divider 105–107 to a reference current, during the time that the controller operates the circuit to measure the voltage across cable 3, the voltage outputs of the amplifiers 111, 122 and 123 will be accurate measurements of the current flowing through the cable. In the circuit of FIG. 3 it is not necessary to know the resistance of cable 3.

Once the auto-cal is completed the controller starts the auto-zero function. It first turns on relay 104, i.e., the center arm would go up. This disconnects the input from the car's cable 3 to the voltage divider 105–107 and places a short circuit across the input to the current measuring circuit. The controller then operates to adjust the center arm of digital potentiometer 114 to set the input voltage at the amplifier 111 reference terminal 111R. This allows the output of amplifier 111 to be adjusted to compensate for internal offsets. This is adjusted until the output of amplifier 111 makes the output at the ±10 Amp amplifier 123 at zero, within a predetermined tolerance. The auto-zero voltage at the output of potentiometer 114 is combined with negative voltage from the junction of voltage divider resistors 117 and 118 to provide a voltage centered on zero for the input to the reference terminal 111R of amplifier 111. Amplifier 119 along with resistors 120 and 121 provides a low impedance drive for the reference terminal 111R of amplifier 111. By using the biasing network of resistors 117 and 118 a positive to negative swing is obtained for the amplifier 111 reference terminal without having the output of potentiometer 114 go negative. The center arm of the digital potentiometer 106 cannot go below the voltage at terminal 114G of digital potentiometer 114 in accordance with manufacturing specifications.

With the correct values of resistors 115 through 118 the reference voltage needed for amplifier 111 can be set to be at the center of the range of digital potentiometer 114. In the selection of components around both digital potentiometers 106 and 114 the adjustment range is set to cover the expected tolerance variations of the ground return cable 3 and various offset voltages caused by component tolerances.

Each of the circuits of FIGS. 1–3 is able to measure and monitor the current flow into and from the vehicle battery without the need for any additional components such as a current shunt.

Modifications of the circuits shown include the use of the cable connected to the battery positive terminal or the use of both cables. For the latter, there can be measurement of the voltage across one cable for battery current flow input and across the other terminal for current flow output. Also, the computer 22 can be provided with a data lookup table to directly convert voltage input data to a current value rather than making the Ohm's law type calculation.

Specific features of the invention are shown in one or more of the drawings for convenience only, as each feature may be combined with other features in accordance with the invention. Alternative embodiments will be recognized by those skilled in the art and are intended to be included within the scope of the claims.

We claim:

1. Apparatus for monitoring current flow to a battery installed in a vehicle, said battery having positive and negative terminals and said apparatus comprising:
    a cable of known resistance value and connected from one of the battery terminals to a point of the vehicle electrical system;
    voltage measuring means connected to measure the voltage variation across said cable only; and
    a computing device for computing the current flow based on the voltage measured across said cable only.

2. Apparatus as in claim 1 wherein the point of the vehicle electrical system to which the cable is connected is the vehicle electrical ground reference.

3. Apparatus as in claim 1 wherein said voltage measuring means includes an analog to digital converter to convert the said measured voltage to a digital value for use by said computing means.

4. Apparatus for monitoring current flow to a battery installed in a vehicle, said battery having positive and negative terminals, and said apparatus comprising:
    a cable having a resistance value and connected from one of the battery terminals to a point of the vehicle electrical system;
    voltage measuring means connected to measure the voltage across said cable only, said voltage measuring means comprising
        a reference current source for producing a voltage corresponding to a reference current of a predetermined value,
        a first amplifier having an output voltage that varies over a range corresponding to the voltage measured across said cable;
        control means for adjusting the input to said amplifier of said voltage measured across said cable only so that its output voltage substantially matches the reference current of predetermined value, and
        second and third amplifiers receiving the output of aid first amplifier, each of said second and third amplifiers having a different gain to correspond to a different range of current values flowing through said cable; and
    a computing device for computing the current flow based on the voltage measured across said cable only.

5. Apparatus for monitoring current flow to a battery installed in a vehicle, said battery having positive and negative terminals, said apparatus comprising
    a cable having a resistance value and connected from one of the battery terminals to a point of the vehicle electrical system;
    voltage measuring means connected to measure the voltage variation across said cable only;
    a computing device for computing the current flow based on the voltage measured across said cable only; and
    wherein said measuring means comprises a differential current sensor including an amplifier producing an output voltage in response to said measured voltage across said cable only, said output voltage varying over a range corresponding to the range of current flowing through said cable.

6. Apparatus as in claim 5 wherein said voltage measuring means also includes an analog to digital converter to convert said output voltage of said current sensor to a digital value for use by said computing means.

7. Apparatus as in claim 6 wherein said analog to digital converter is bipolar and said differential current sensor has a reference set to place the center of said output voltage swing substantially at zero.

8. Apparatus as in claim 6 wherein said analog to digital converter is unipolar and said differential current sensor has a reference set to place the center of said output voltage swing substantially at the center of the range of said converter.

9. Apparatus for monitoring current flow to a battery installed in a vehicle, said battery having positive and negative terminals, and said apparatus comprising:
    a cable having a resistance value and connected from one of the battery terminals to a point of the vehicle electrical system;
    voltage measuring means connected to measure the voltage variations across said cable only, said voltage measuring means comprising
        a reference current source for producing a voltage corresponding to a reference current of a predetermined value,
        an amplifier having an output voltage that varies over a range corresponding to the voltage measured across only said cable, and
        control means for adjusting the input to said amplifier of said voltage variation measured across said cable only so that its output voltage substantially matches the reference current of predetermined value; and
    a computing device for computing the current flow based on the voltage measured across said cable only.

10. Apparatus as in claim 9 wherein said amplifier has a reference voltage input to set its operating point and further comprising a source of voltage for supplying a voltage to said amplifier reference voltage input to offset for circuit tolerance variations.

11. Apparatus as in claim 9 wherein said control means comprises:
    an analog to digital converter to convert the output voltage of said current reference source and of said amplifier to digital values, said converter determining the difference between the two digital values and producing a digital control signal corresponding thereto; and
    a digital potentiometer responsive to said digital control signal to adjust the input to said amplifier.

12. Apparatus as in claim 11 further comprising:
    second and third amplifiers receiving the output of said first mentioned amplifier, each of said second and third amplifiers having a different gain to correspond to a different range of current values flowing through said cable.

13. Apparatus as in claim 12 wherein said first mentioned amplifier has a reference voltage input to set its operating point and further comprising a source of voltage for supplying a voltage to said amplifier reference voltage input to offset for circuit tolerance variations.

14. Apparatus as in claim 4 wherein said voltage measuring means measures the voltage across only the cable.

* * * * *

UNITED STATES PATENT AND TRADEMARK OFFICE
CERTIFICATE OF CORRECTION

PATENT NO.    : 6,285,191 B1
DATED         : September 4, 2001
INVENTOR(S)   : Gollomp et al.

It is certified that error appears in the above-identified patent and that said Letters Patent is hereby corrected as shown below:

Title page,
Showing an illustrative figure, should be deleted and substituted therefor the attached title page.

Drawings,
Delete drawing sheet 1, and substitute therefor the drawing sheet, consisting of FIG. 1, as shown on the attached page.

Signed and Sealed this

Ninth Day of July, 2002

Attest:

Attesting Officer

JAMES E. ROGAN
Director of the United States Patent and Trademark Office

United States Patent
Gollomp et al.

(10) Patent No.: US 6,285,191 B1
(45) Date of Patent: Sep. 4, 2001

(54) MEASUREMENT OF CURRENT IN A VEHICLE USING BATTERY CABLE AS A SHUNT

(75) Inventors: Bernard P. Gollomp, Palisades, NY (US); Thirumalai G. Palanisamy, Morris Township, Morris County; John Kacerek, Madison, both of NJ (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/415,310

(22) Filed: Oct. 8, 1999

(51) Int. Cl.$^7$ .................................................. G01N 27/416
(52) U.S. Cl. ............................................ 324/427; 324/428
(58) Field of Search .................................. 320/161, 162, 320/132, 137; 324/427, 428

(56) References Cited

U.S. PATENT DOCUMENTS

| | | | |
|---|---|---|---|
| 5,381,097 | * | 1/1995 | Hirzel ................................ 324/512 |
| 5,444,378 | * | 8/1995 | Rogers ............................... 324/428 |
| 5,589,757 | * | 12/1996 | Klang ................................ 320/160 |
| 5,691,078 | * | 11/1997 | Kozaki et al. ..................... 324/428 |
| 5,847,566 | * | 12/1998 | Marritt et al. ..................... 324/427 |
| 6,037,749 | * | 3/2000 | Parsonage ......................... 320/132 |

\* cited by examiner

Primary Examiner—Peter S. Wong
Assistant Examiner—Lawrence Luk
(74) Attorney, Agent, or Firm—Loria B. Yeadon (57) ABSTRACT

Current flowing into and out of a battery installed in a vehicle (V) with the required cable between one of the battery terminals and a reference point on the vehicle is determined by measuring the voltage across the cable and computing the current from the digital value of the measured current. The resistance value of the cable can be known in which case the current is computed using Ohms law and a differential current sensor can be used to respond to the voltage measured across the cable to accommodate for different ranges of current. In an embodiment where the cable resistance is unknown, a reference current source produces a known voltage that is used to set the input value to an amplifier of fixed gain for the voltage measured across the cable by controlling the output of a potentiometer so that the amplifier output voltage can be set to match the reference current generator output voltage, thereby establishing the voltage output of the amplifier as a measurement of the current flow in the cable.

14 Claims, 3 Drawing Sheets

FIG. 1